(12) United States Patent
Lou et al.

(10) Patent No.: US 11,814,971 B2
(45) Date of Patent: *Nov. 14, 2023

(54) PROBE PLACEMENT OPTIMIZATION IN GAS TURBINE ENGINES

(71) Applicant: Purdue Research Foundation, West Lafayette, IN (US)

(72) Inventors: Fangyuan Lou, Crown Point, IN (US); Nicole Leanne Key, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,658

(22) Filed: Apr. 24, 2023

(65) Prior Publication Data

US 2023/0258102 A1 Aug. 17, 2023

Related U.S. Application Data

(63) Continuation of application No. 17/461,753, filed on Aug. 30, 2021, now Pat. No. 11,634,999.

(Continued)

(51) Int. Cl.
*F01D 21/00* (2006.01)
*F04D 27/00* (2006.01)
*G06F 30/28* (2020.01)

(52) U.S. Cl.
CPC ......... *F01D 21/003* (2013.01); *F04D 27/001* (2013.01); *G06F 30/28* (2020.01); *F05D 2200/11* (2013.01); *F05D 2200/14* (2013.01); *F05D 2200/211* (2013.01); *F05D 2200/30* (2013.01); *F05D 2220/32* (2013.01);

(Continued)

(58) Field of Classification Search
CPC ...... F01D 21/003; F01D 21/12; F04D 27/001; F05D 2200/11; F05D 2200/14; F05D 2200/211; F05D 2200/30; F05D 2220/32; F05D 2230/60; F05D 2270/20; F05D 2270/301; F05D 2270/303; F05D 2270/803; G06F 30/28

See application file for complete search history.

(56) References Cited

U.S. PATENT DOCUMENTS

2016/0131146 A1* 5/2016 Zhang ...................... F02C 7/04
415/118

FOREIGN PATENT DOCUMENTS

GB 2124706 A * 2/1984 ........... F01D 17/085

* cited by examiner

*Primary Examiner* — J. Todd Newton
*Assistant Examiner* — Wayne A Lambert
(74) *Attorney, Agent, or Firm* — Piroozi-IP, LLC

(57) ABSTRACT

A method of optimizing probe placement in a turbomachine is disclosed which includes establishing a design matrix A of size m×(2N+1) utilized in developing flow properties around an annulus of a turbomachine, where m represents the number of datapoints at different circumferential locations around the annulus, and N represents dominant wavelets generated by upstream and downstream stators and blade row interactions formed around an annulus, wherein m is greater or equal to 2N+1, and optimizing probe positioning by iteratively modifying probe positions placed around the annulus and for each iteration determining a condition number of the design matrix A for each set of probe positions until a predetermined threshold is achieved for the condition number representing an optimal probe layout.

14 Claims, 11 Drawing Sheets

Related U.S. Application Data

(60) Provisional application No. 63/073,024, filed on Sep. 1, 2020, provisional application No. 63/073,029, filed on Sep. 1, 2020.

(52) U.S. Cl.
CPC ...... *F05D 2230/60* (2013.01); *F05D 2270/20* (2013.01); *F05D 2270/301* (2013.01); *F05D 2270/803* (2013.01)

PROBE PLACEMENT OPTIMIZATION IN GAS TURBINE ENGINES

CROSS-REFERENCE TO RELATED APPLICATIONS

The present patent application is a continuation of U.S. Non-Provisional patent application Ser. No. 17/461,753 filed Aug. 30, 2021, entitled PROBE PLACEMENT OPTIMIZATION IN GAS TURBINE ENGINES which is related to and claims the priority benefit of U.S. Provisional Patent Application Ser. No. 63/073,024, entitled PROBE PLACEMENT OPTIMIZATION IN GAS TURBINE ENGINES, filed Sep. 1, 2020, and U.S. Provisional Patent Application Ser. No. 63/073,029, entitled METHOD FOR RECONSTRUCTING NON-UNIFORM CIRCUMFERENTIAL FLOW IN GAS TURBINE ENGINES, filed Sep. 1, 2020, the contents of which are hereby incorporated by reference in its entirety into the present disclosure.

STATEMENT REGARDING GOVERNMENT FUNDING

None.

TECHNICAL FIELD

The present disclosure generally relates to gas turbine engines and in particular, to an optimized methodology of probe placement to measure the mean flow properties such as temperature and pressure.

BACKGROUND

This section introduces aspects that may help facilitate a better understanding of the disclosure. Accordingly, these statements are to be read in this light and are not to be understood as admissions about what is or is not prior art.

A flow field in a compressor is circumferentially non-uniform. The circumferential variations measured in an absolute reference frame are associated with the wakes from upstream stator row(s), potential fields from both upstream and downstream stator rows, and their aerodynamic interactions. In a typical engine or technology development programs, the performance such as thermal efficiency of the engine or component is commonly characterized using measurements acquired from a few probes at different circumferential locations. However, because the flow in a gas turbine engine is non-uniform along the circumferential direction, the calculated engine performance using measurements from one probe set can be different from another probe set with changes in the circumferential locations.

Also, stator-stator and rotor-rotor interactions can impact stage performance. For example, in a 2.5-stage transonic axial compressor a 0.1% efficiency variation was seen due to stator-stator interactions and a maximum of 0.7% variation in efficiency was observed caused by rotor-rotor interactions. The effect of stator-stator interactions on stage performance have been investigated using vane clocking, the circumferential indexing of adjacent vane rows with the same vane count. According to another example, in a 3-stage axial compressor a 0.27-point variation in the isentropic efficiency of the embedded stage was observed at the design loading condition and a 1.07-point variation in the embedded stage efficiency was observed at a high loading condition with changes in vane clocking configurations. The experimental characterization of stage efficiency is facilitated when similar vane counts exist because that means that measuring the flow across a single vane passage will accurately capture the full-annulus performance. This is great for research, but it is not a common luxury for real compressors, in which the stators typically have different vane counts requiring measurements over several pitches, if not the entire annulus, to accurately capture the circumferential flow variations.

Therefore, to accurately measure temperature and pressure profiles, probes on rakes are typically mounted during operation. To characterize the performance of a compressor, the rakes are typically equally spaced at several stations (fixed axial positions) around the annulus. At each station, the thermodynamic properties acquired from the probes at different locations are averaged to a single value to represent the mean flow property. Historically, a simple area-average has been used because of the associated simplicity in implementation. Other averaging methods have emerged including mass-average, work-average, and momentum-average methods during the past few decades, all of which require additional flow field information. However, regardless of the different averaging methods used, without the detailed information of flow properties around the full annulus, the accuracy of the averaged value as a representation of the true mean flow property is limited, and understanding how much error it can introduce into the calculation of compressor performance is important. To answer this question, one prior art conducted a full annulus URANS simulation in a 3.5-stage axial compressor at midspan and showed that the circumferentially non-uniform flow can cause more than a one-point error in compressor stage performance measurements. In another recent prior art they investigated the instrumentation errors caused by circumferential flow variations in an 8-stage axial compressor representative small core compressor of an aero-engine. The analysis showed that a baseline configuration with 3 equally spaced probes around the annulus yields a maximum of 0.8% error in flow capacity and 2.8 points error in compressor isentropic efficiency. Since designers are working hard to find efficiency improvements on the order of 0.1 points, a 2.8-point uncertainty in efficiency is not sufficient for confirmation of typical performance improvements in technology development programs probe.

Therefore, it is of great value to resolve the compressor non-uniform circumferential flow for precise calculation of compressor performance, as well as better prediction of blade forced response. Historically, experimental characterization of the circumferential flow variation is achieved by circumferentially traversing the flow, either utilizing a probe traverse mechanism or utilizing fixed instrumentation while actuating the stator rows circumferentially. These approaches involve the design of complex traverse mechanisms that are challenging to seal and can be costly.

Therefore, there is an unmet need for a novel approach for probe placement at different circumferential locations to arcuately determine turbine engine performance characteristics such as thermal efficiency of the engine.

SUMMARY

A method of optimizing probe placement in a turbomachine is disclosed. The method includes establishing a design matrix A of size m×(2N+1) utilized in developing flow properties around an annulus of a turbomachine, where m represents the number of datapoints at different circumferential locations around the annulus, and N represents dominant wavelets generated by upstream and downstream stators and blade row interactions formed around an annulus, wherein m is greater or equal to 2N+1. The method further includes optimizing probe positioning by iteratively modifying probe positions placed around the annulus and for each iteration determining a condition number of the design matrix A for each set of probe positions until a predetermined threshold is achieved for the condition number representing an optimal probe layout.

DETAILED DESCRIPTION

Figure 1:
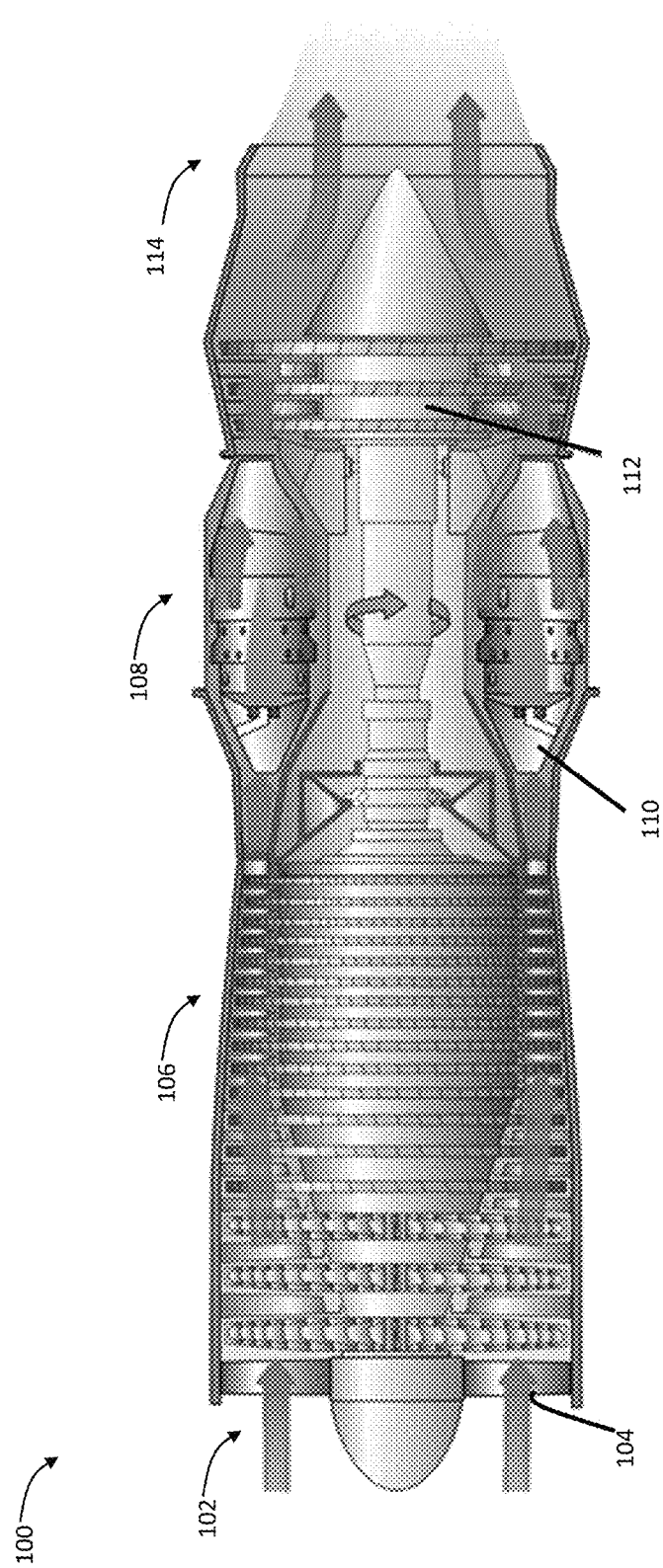
FIG. 1 is a schematic of a typical gas turbine engine.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach is provided in the present disclosure for probe placement at different circumferential locations to arcuately determine turbine engine performance characteristics such as thermal efficiency of the engine. This novel approach aims to reconstruct compressor nonuniform circumferential flow field using spatially under-sampled data points from a few probes at fixed circumferential locations. The approach principally utilizes a Particle Swarm Optimization algorithm for selection of optimal probe position. Consequently, the method bridges the gap between sparsely distributed experimental data and the detailed flow field of a full annulus. Through the two experiments in different types of compressors, the method shows great potential in obtaining suitable mean flow properties for performance calculations as well as resolving the important flow features associated with circumferential non-uniformity. The method can be disruptive to the gas turbine community concerning: expectations of experimental data; how and where to place the probes; and the method to calculate suitable mean flow properties.

Figure 2:
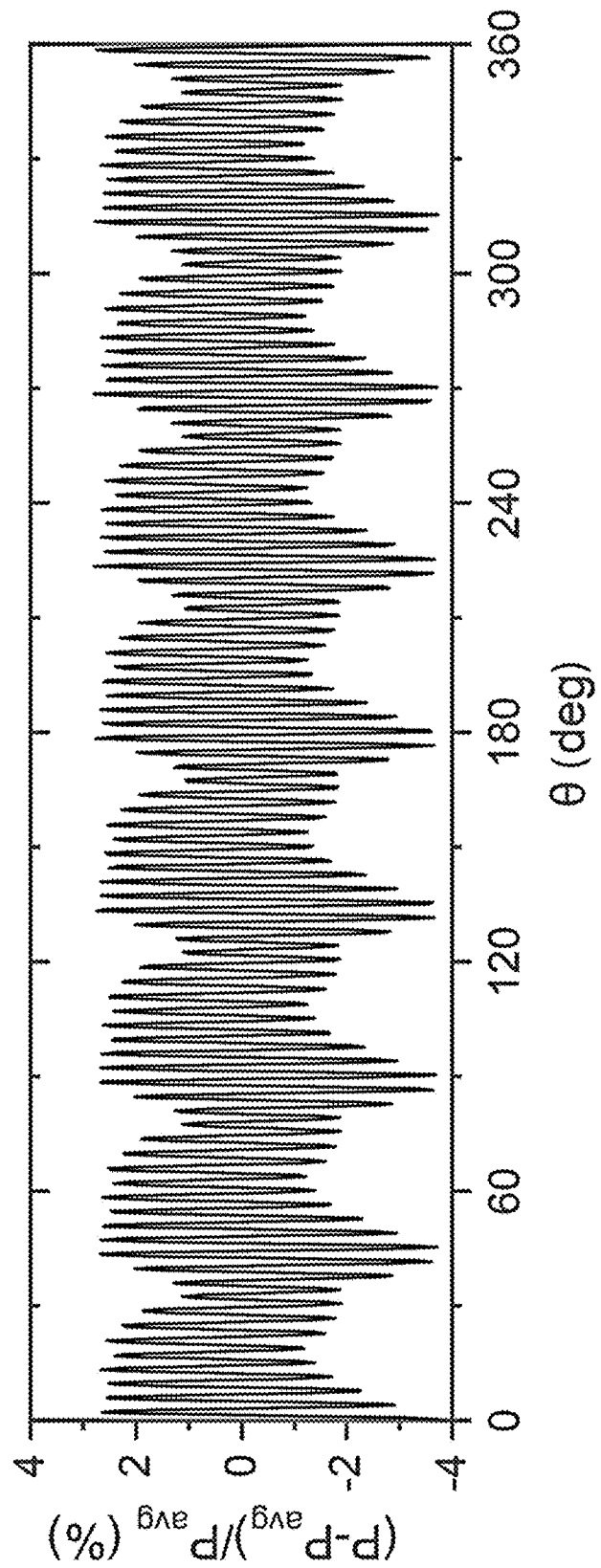
FIG. 2 is a graph of circumferential total pressure field at mid-span upstream of stator number 6 in a multi-stage axial compressor at different angular positions.
Figure 3A:
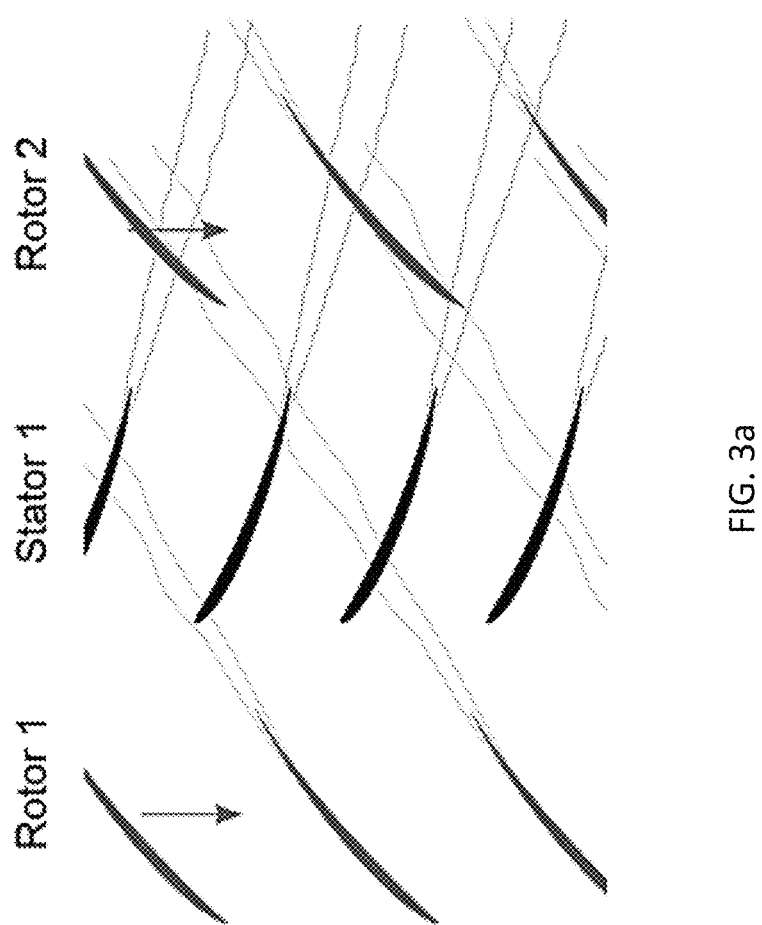
FIG. 3a is a schematic representation of flow interactions stemming from blades of two rotors and a stator representing blade row interactions which result in complex circumferential nonuniform flow patterns.

A gas turbine engine typically includes three elements including: a compressor, a combustor, and a turbine. Referring to FIG. 1, a schematic of a typical gas turbine engine 100 is shown. The gas turbine engine 100 typically includes an intake 102 which includes an air intake 104 having an initial cross sectional area through which air is allowed into the gas turbine engine 100 at a high rate of speed. The incoming air is compressed through a compressor 106 which reduces the effective cross section prior to entering into a combustion zone 108 having one or more combustion chambers 110. In the one or more combustion chambers 110, the compressed air is energized and then is directed to turbines 112 prior to being ejected out of an exhaust 114. The compressor 106 or turbines 112 include stationary blade rows which are called stators as well as rotating blade rows which are called rotors. Each includes a plurality of stages. Thus, a stage includes a stator and a rotor. The flow field in a compressor or turbine is circumferentially non-uniform due to the wakes from upstream stators, the potential field from both upstream and downstream stators, and blade row interactions. To demonstrate this non-uniformity, reference is made to FIG. 2 which shows the circumferential total pressure field at mid-span upstream of stator number 6 in a multi-stage axial compressor. The abscissa represents the circumferential position along the full annulus and the ordinate represents the normalized nondimensional pressure. As described above, this observed non-uniformity is due to the wakes from upstream stator row(s), potential fields from both upstream and downstream stator rows, and their aerodynamic interactions. These interactions are shown in FIG. 3a which provides a schematic representation of flow interactions stemming from blades of two rotors and a stator representing blade row interactions which result in complex circumferential nonuniform flow patterns.

In theory, the circumferential flow field in turbomachines with a spatial periodicity of a can be described in terms of infinite serial wavelets of different wavenumbers:

$$x(\theta)=c_0+\Sigma_{i=1}^{\infty}(A_i \sin)W_{n,i}\theta+\varphi_i)), \quad (1)$$

where $x(\theta)$ represents the flow property along the circumferential direction,
$c_0$ represents the mean component of $x(\theta)$,
$W_n$ is abbreviated for wavenumber,
$W_{n,i}$ represents the $i^{th}$ wavenumber, and
$A_i$ and $\varphi_i$ represent the magnitude and phase of the wavelet of the $i^{th}$ wavenumber. A wavenumber is the spatial frequency of a wave, measured in cycles per unit distance or radians per unit distance. In the present disclosure, the wave number is also referred to as the spatial frequency of a wave along the circumferential direction per $2\pi$.

Furthermore, defining $a_i=A_i \cos \varphi_i$ and $b_i=A_i \sin \varphi_i$, Eqn. (1) can be cast as:

$$x(\theta)=c_0+\Sigma_{i=1}^{\infty}(a_i \sin(W_{n,i}\theta)+b_i \cos(W_{n,i}\theta)). \quad (2)$$

The circumferential flow in a multi-stage compressor is typically dominated by several wavenumbers. Therefore, instead of using an infinite number of wavelets described in Eqn. (1), the circumferential flow in the compressor can be approximated by a few (N) dominant wavelets (where the dominance is measured by the magnitude based on a predetermined threshold weight of magnitude) by the approximation:

$$x(\theta) \approx c_0 + \Sigma_{j=1}^{N}(a_j \sin(W_{n,j}\theta) + b_j \cos(W_{n,j}\theta)). \quad (3)$$

The above approximation is an important step toward reconstructing the circumferential flow field since it reduces the number of unknown coefficients from infinity in Eqn. (1) to 2N+1 in Eqn. (3).

To solve an equation of 2N+1 unknowns, a minimum of the same amount of data points (i.e., measurements from circumferentially positioned probes) measured at different circumferential locations, $\theta = (\theta_1, \theta_2, \theta_3, \ldots \theta_m)$, is required, where $\theta$ is the circumferential location along the annulus, which can be any value from 0 to 360 in degree (or 0 to $2\pi$ in rads). The system can be described with:

$$AF = x, \quad (4)$$

where A is known as the design matrix with a dimension of m×(2N+1),
F is a vector containing 2N+1 unknown coefficients, and
x is a m-element vector with all the measurement data points from different circumferential locations. The mathematical expressions for A, F, and x are $$A = \begin{pmatrix} \sin W_{n,1}\theta_1 & \cos W_{n,1}\theta_1 & \ldots & \sin W_{n,N}\theta_1 & \cos W_{n,N}\theta_1 & 1 \\ \sin W_{n,1}\theta_2 & \cos W_{n,1}\theta_2 & \ldots & \sin W_{n,N}\theta_2 & \cos W_{n,N}\theta_2 & 1 \\ \vdots & \vdots & \vdots & \vdots & \vdots & \vdots \\ \sin W_{n,1}\theta_m & \cos W_{n,1}\theta_m & \ldots & \sin W_{n,N}\theta_m & \cos W_{n,N}\theta_m & 1 \end{pmatrix};$$

$$F = \begin{pmatrix} a_1 \\ b_1 \\ \vdots \\ a_N \\ b_N \\ c_0 \end{pmatrix};$$

$$x = \begin{pmatrix} x(\theta_1) \\ x(\theta_2) \\ \vdots \\ x(\theta_m) \end{pmatrix}$$

To solve for the N wavenumbers of interest described in Eqn. (4), the number of the data points in vector x must be equal or greater than the number of unknown coefficients, or m≥2N+1. However, in practice, the reconstructed signal contains errors due to the uncertainties in x(θ), and it is important to evaluate the confidence in the reconstructed signal, which requires additional data points in x(θ). Therefore, a minimum of 2N+2 measurement points is recommended to characterize N wavenumbers of interest. Therefore, the wavenumber of interest is first determined and then probe placement optimization is carried out with the determined wavenumber. The probe placement optimization is carried out using a Particle Swarm Optimization algorithm. Each of these steps are discussed below in greater detail.

Determining wavenumber: Even though the circumferential flow in compressors can be approximated using a few dominant wavelets, resolving all of these wavenumbers can still be challenging. In practice, due to the cost and blockage associated with each probe, there is usually a limit on the number of probes allowed per blade row. Typically, a range of 3 to 8 rakes/probes per blade row is achievable. However, according to Eqn. (3), a set of 4, 6, and 8 probes can resolve 1, 2, and 3 wavenumbers, respectively. Thus, an intelligent selection of the most important wavenumbers is needed to assure the best results for reconstructing the signal from a limited number of probes. The most important wavenumbers can be determined with the help of information from either reduced-order modeling or high-fidelity computational fluid dynamics simulations. For cases with no information available except for airfoil counts, recommended guidelines based on previous research of multi-stage interactions for representative wavenumber selection are:

1. Upstream and downstream vane counts;
2. Differences of the upstream and downstream vane counts;
3. Wavenumbers associated with low-count stationary component (i.e. upstream and downstream struts for the front and rear stages).

Figure 3B:
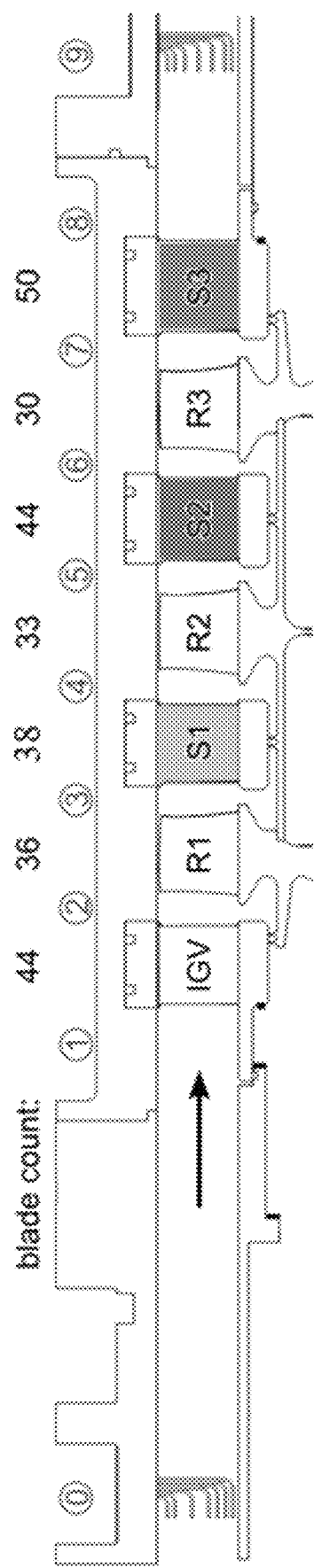
FIG. 3b is a schematic of a typical multi-stage axial compressor used in high-pressure compressor (HPC) assembly of gas turbines.

For instance, FIG. 3b is a schematic of a typical multi-stage axial compressor used in high-pressure compressor (HPC) assembly of gas turbines. The dominant wavenumbers for the flow downstream of stator 2 include: 1) 38 (stator 1 vane count), 44 (stator 2 vane count), and 50 (stator 3 vane count); 2) 8 (the difference of upstream vane count) and 6 (the difference of the downstream vane count); and 3) 4 (the vane count of the upstream struts), which is not shown in the figure. Therefore, a selection of 6 wavelets is appropriate. The process of selecting wavelet and wavenumber is further demonstrated in Table 1, below.

TABLE 1

Selection of wavelet and wavenumber

| No. of Wavelets | Wavenumber | Consideration | Criterion |
|---|---|---|---|
| 1 | 38 | Upstream blade row (s1) vane count | 1st |
| 2 | 44 | Vane count of itself (S2) | 1st |
| 3 | 50 | Downstream blade row (S3) vane count | 1st |
| 4 | 8 | S2 − S1 = 44 − 38 = 8 | 2nd |
| 5 | 6 | S3 − S2 = 50 − 44 = 6 | 2nd |
| 6 | 4 | Vane count of inlet Struts | 3rd |

As a result, 6 dominant wavelets can be selected along with wavenumbers are 38, 44, 50, 8, 6, 4, respectively.

With selection of the wavenumbers of interest, a condition number of the design matrix describes how well the probes are distributed to capture the wavenumbers of interest and determine the confidence interval of the reconstructed flow field, making it an important parameter for the selection of probe locations.

In the field of numerical analysis, the condition number of a function measures how much the output value of the function can change for a small change in the input argument. This parameter is used to measure how sensitive a function is to changes or errors in the input, and how much error in the output results from an error in the input. A system with a low condition number is said to be well-conditioned, while a system with a high condition number is said to be ill-conditioned. In the present disclosure, the condition number gauges how sensitive the reconstructed flow is to the errors in the probe placement. The objective of the probe placement optimization is to minimize the condition number of the design matrix.

The condition number of a matrix is calculated using the formula:

$$k = \|A\| \|A^+\|, \quad (5)$$

where $A^+$ is the inverse of matrix A for a square matrix and the Moore-Penrose pseudoinverse of matrix A for a rectangular matrix. The double-line represents the norm of a matrix. Simply put, the norm of a matrix represents the strength (i.e., the value of the matrix). To calculate a norm of a matrix four conditions must be met: 1) the norm is equal or greater than 0 (the norm can be 0 only and only if the matrix is a 0 matrix); 2) scalar property (i.e., $\|kA\|=|k|\cdot\|A\|$); 3) additive property (i.e., $\|A+B\|\le\|A\|+\|B\|$; and 4) multiplicative property (i.e., $\|A\cdot B\|\le\|A\|\cdot\|B\|$). There are several matrix norms that can be used to define the condition number in equation 5. For example, one norm is the maximum sum of absolute numbers in each column (i.e., absolute values in each column are added together to generate one or more sums, and the maximum is the one norm). The infinity norm is the maximum sum of absolute number in each row (i.e., absolute values in each row are added together to generate one or more sums, and the maximum is the infinity norm). Euclidean norm is the square root of the sum of all squares (i.e., each entry in the matrix is squared and added together, the Euclidean norm is the square root of that sum). The two norm is a bit more complicated. The two norm is the square root of the maximum eigenvalue of the matrix $(A^T \cdot A)$, where $A^T$ is the transpose of A for a real matrix. For a complex matrix, $A^T$ is replaced with the Hermitian conjugate of A. Eigenvalues of a matrix is defined by solving $det(A^T \cdot A - \delta I)=0$ where, det represents the determinant of the entity in the parentheses, $\delta$ represents the eigenvalues, and I represents the identity matrix. Thus, in order to find the two norm of matrix A, first the eigenvalues of matrix $A^T \cdot A$ is found, then the maximum eigenvalue is chosen, and then the square root of that maximum eigenvalue represents the two norm of the matrix A. There are still yet other norms including max norm (which is the largest absolute value of all the entries in a matrix), P norm, and other norms known to a person having ordinary skill in the art. Any of these norms can be used to calculate the condition number of the matrix A according to equation 5.

In the present disclosure, the condition number of design matrix A is determined by both probe location, $\theta$, and the wavenumbers of interest, $W_n$. The value of the condition number of the design matrix can vary from one to infinity. As discussed above, a system with a large condition number can result in excessive error in the reconstructed signal.

Applying the Particle Swarm Optimization algorithm: Particle swarm optimization (PSO) is a known optimization technique for solving global optimization problems due to its high efficiency of convergence. It was first introduced for simulation of simplified animal social behaviors such as bird flocking. In the PSO algorithm, a potential solution is called a particle, which has two representative parameters including the position and velocity. The optimization starts with an initial population of particles and then moves these particles around in the search-space. The movement of each particle is influenced by its local best-known position as well as the global best-known position in the entire search space. As a result, the swarm is iteratively moving toward the best solution.

In the present disclosure, PSO is used to search for the optimal probe positions that yields the smallest condition number of the design matrix. Therefore, the design variables (parameters being optimized) are the circumferential positions of probes, $\theta$, and the objective function is described using:

$$f_{obj}=k(\theta, W_n)+f_{constraint}, \quad (6)$$

where $f_{constraint}$ represents the value of the constraint function from considerations of geometric constraints for placing probes. Two representative constraints in turbomachines include minimum spacing between adjacent probes and restricted areas due to casing fixtures. Probes in turbomachines are typically casing-mounted through a variety of instrumentation ports. A minimum probe spacing is, therefore, necessary for practical implementation. The formula for minimum probe spacing is described:

$$|\Delta\theta_{j,i}|=|\theta_j-\theta_i|\ge\theta_{min}. \quad (7)$$

where $\theta_i$ and $\theta_j$ represent the circumferential position of the $i^{th}$ and $j^{th}$ probes, respectively, $\Delta\theta_{j,i}$ is spacing between the $i^{th}$ and $j^{th}$ probes, and
$\theta_{min}$ represents the minimum probe spacing allowed.

Additionally, in many scenarios, it may not be possible to install probes at all positions around the circumference due to fixtures or obstructions on certain regions of the casing. A constraint is, therefore, required to prevent probes from being placed in these circumferential ranges. The formula for constraints due to casing fixtures is described:

$$\theta_i \tilde{\in} [\theta^*_{1,min}, \theta^*_{1,max}]|[\theta^*_{2,min}, \theta^*_{2,max}] \cdots |[\theta^*_{p,min}, \theta^*_{p,max}], \quad (8)$$

in which, $\theta^*_{p,min}$ and $\theta^*_{p,max}$ represents the minimum and maximum fixture location for the $p^{th}$ fixture. During the optimization process, if the position of any probe violates any of the constraints, a "penalty" or "cost" will be assigned to the constraint function to prevent probe placement in that region. At last, it is worth noting that the PSO used according to the present disclosure can also be exchanged by other global optimization techniques for probe optimization.

Figure 4:
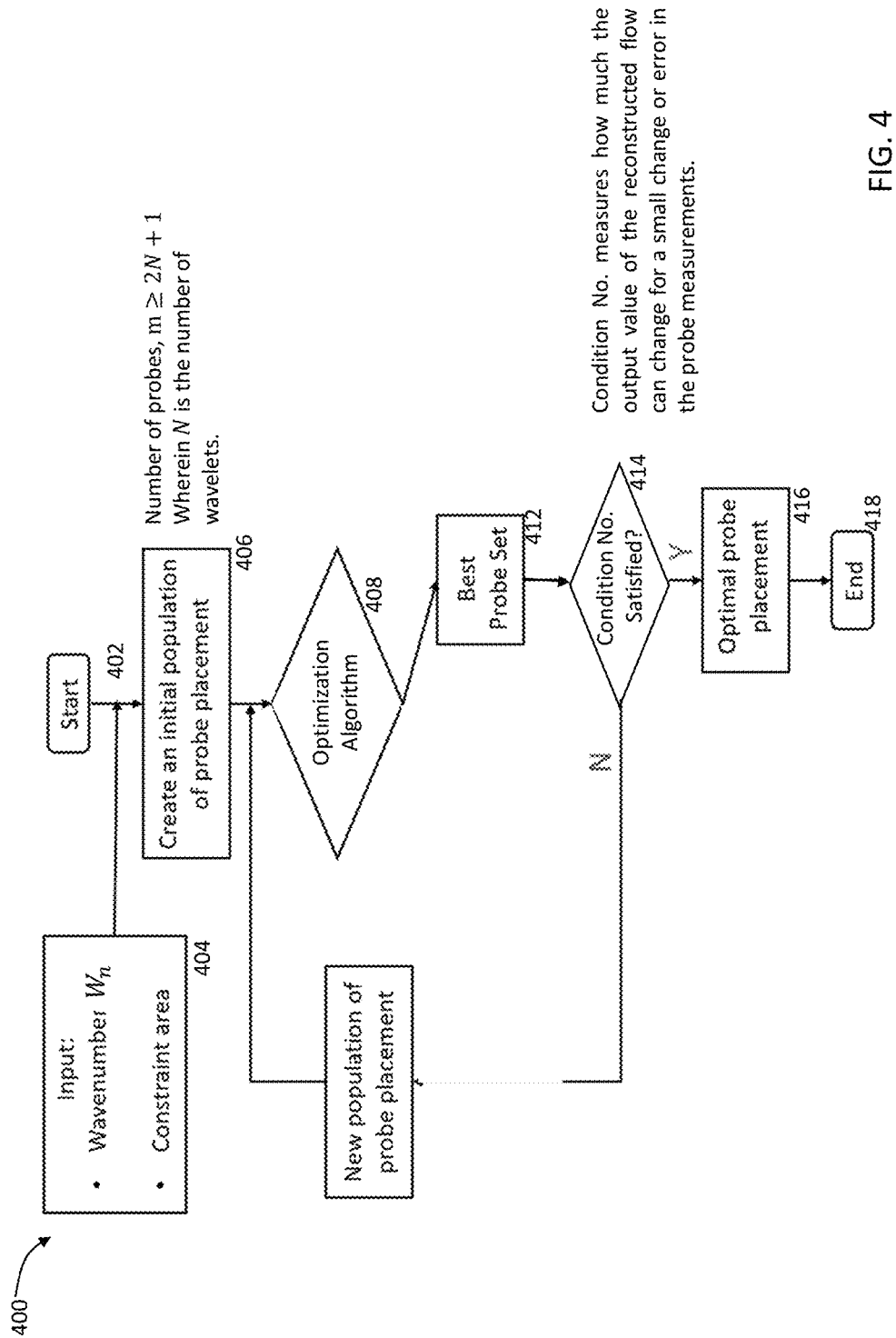
FIG. 4 is a flowchart depicting steps of defining optimal probe positions based on a minimum condition number according to the present disclosure using a Particle swarm optimization algorithm.

Referring to FIG. 4, a flowchart 400 is shown depicting the steps using the PSO algorithm for optimization of probe placement. After initialization 402, the method of the present disclosure receives a wavenumber of interest and any constraint areas as discussed above and as represented by block 404. The method then generates an initial probe placement according to a predetermined positioning pattern (which is not optimized), as represented by block 406. This pattern may be randomly chosen, or based on some apriori knowledge, e.g., a probe at each stage. An algorithm as indicated by block 408 is then applied. The PSO algorithm as indicated by block 408 is shown in the inset and is further described below. The output of the optimization algorithm as indicated by block 408 includes optimal positions of the probes as indicated by the block 412. Based on the probe position output of the optimization algorithm, the condition number is calculated. If the condition number satisfies a predetermined threshold as indicated by the block 414, the probe positions constitute the optimum probe placement as indicated by the block 416 and the probe placement algorithm ends as indicated by the block 418. If, however, the calculated condition number does not satisfy the predetermined threshold as test in block 414, then a new generation (iteration) of probe placement is generated based on the particle velocity of the last iteration (shown with a dashed line). Objective criteria, according to one embodiment of the present disclosure, for the condition number are:
$k\le 2.0$ if No. of $Wn<3$;
$k\le 4.0$ if $3\le$No. of $Wn<5$; and
$k\le 6.0$ if No. of $Wn\ge 5$.

The algorithm shown in the inset of FIG. 4 is known by a person having ordinary skill in the art. Several state-of-the-art optimization algorithms such as Particle Swarm Optimization (PSO), simulated annealing (SA) algorithms, Genetic algorithms (GAs), evolutionary algorithms (EAs) etc., can be used to find the optimal probe positions.

Figure 5:
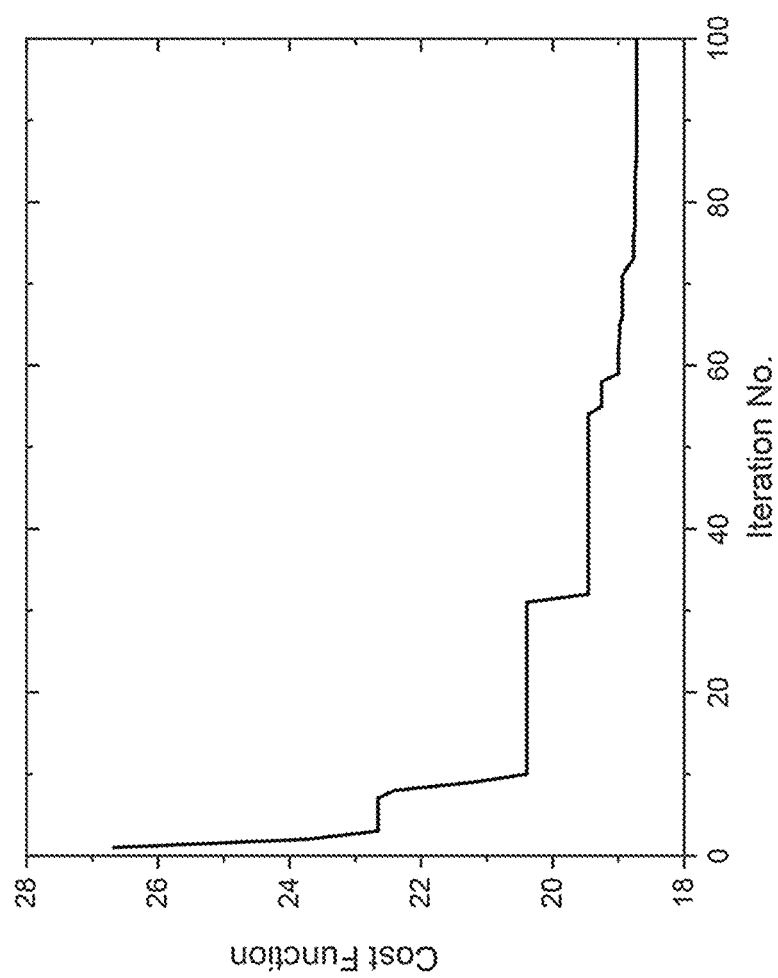
FIG. 5 is a graph of a cost function which represent a combination of condition number vs. impermissible probe position for different iterations.

To demonstrate the efficacy of this novel approach, an actual reduction to practice was carried out using the particle swarm optimization (PSO) algorithm, in which a particle swarm size of 5,000 was chosen, and the optimization was run for 100 iterations. Referring to FIG. 5, a graph of a cost function vs. iteration number is provided which shows the change in the value of objective function during one optimization run. Results show that the value of the objective function decreases quickly during the first 20 iterations and gradually settles around 19 after 60 iterations. Based on this observation, a selection of 100 iterations is a proper number, according to one embodiment of the present disclosure.

Figure 6A:
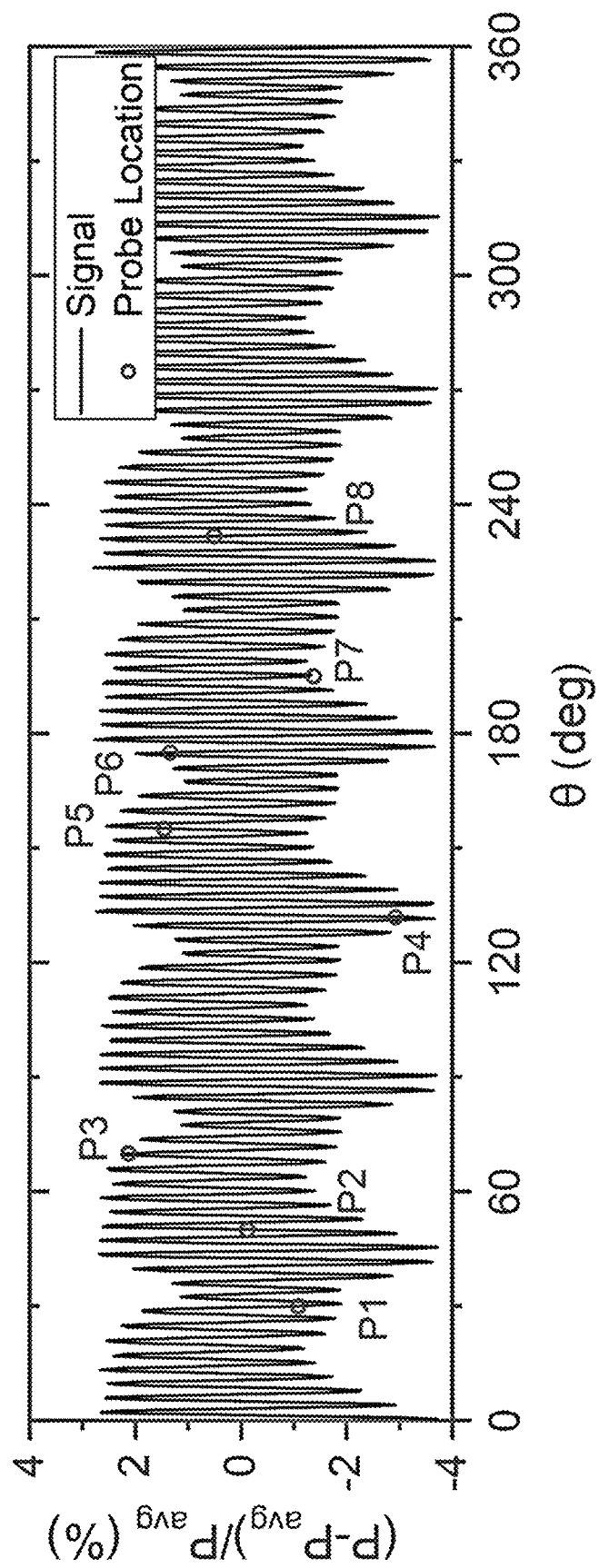
FIG. 6a is a graph similar to FIG. 2 with probe position shown.
Figure 6B:
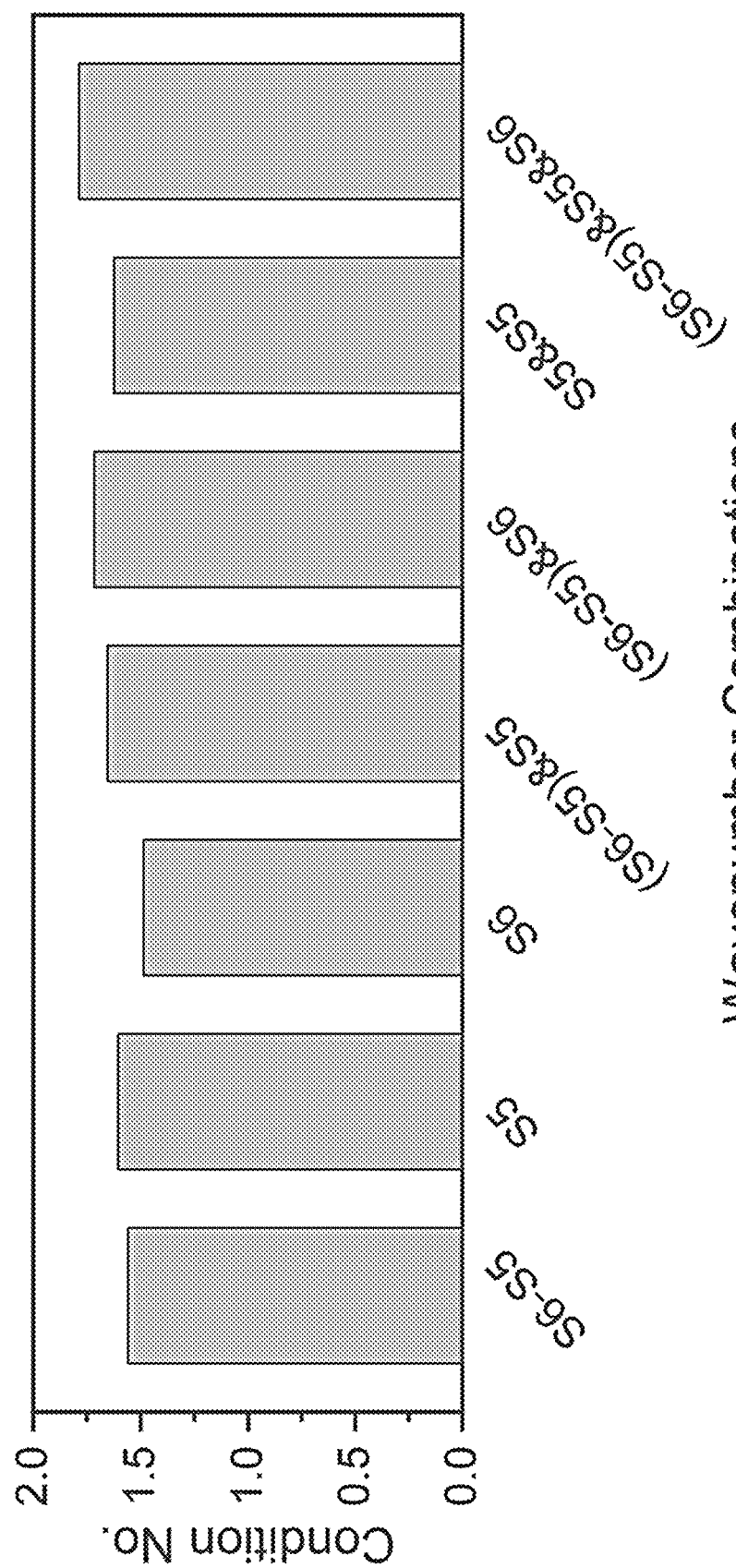
FIG. 6b is histogram of condition number vs. wavenumber combinations.

The final probe positions from the run shown in FIG. 5 is indicated by the circles in FIG. 6a. The probe positions are labeled as P1, P2, P3 . . . respectively. One evident feature associated with the optimized probe set is that they are not equally spaced. The maximum probe spacing falls between P3 and P4, with a value of 62°, while the minimum probe spacing is 20°. This non-uniform probe spacing allows for characterization of all wavenumbers of interest. In addition, FIG. 6b shows the values of condition number for all combinations of wavenumbers of interest. The abscissa indicates the combinations of all wavenumbers of interest while the ordinate represents the condition number. As shown in FIG. 6b, the condition numbers are fairly constant for all combinations of wavenumbers. This is expected and also consistent with the nature of the objective function, which had a constant weighting factor for all combinations of wavenumbers. The largest condition number for all the combinations of wavenumbers is less than 2. This indicates that the optimized probe set can discern all the wavenumbers of interest. Thus, the PSO algorithm is capable of optimizing probe positions effectively, yielding small condition numbers for all wavenumbers of interest.

Figure 7A:
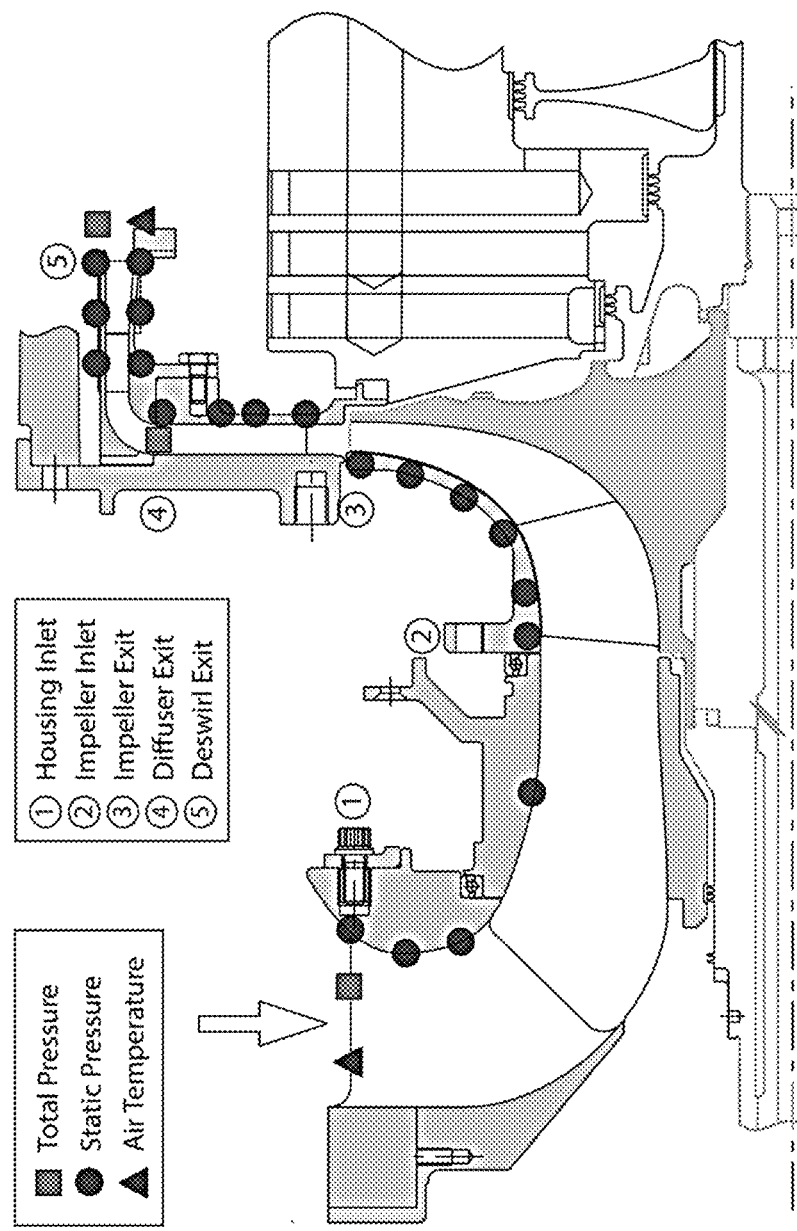
FIG. 7a is a schematic of a flow path of a compressor and distribution of the steady instrumentation.

To further provide a proof of this concept, a compressor was used to provide an actual reduction to practice examples. The objective is to determine optimal sensor placement. The flow path of the compressor and distribution of the steady instrumentation is shown in FIG. 7a. The entire stage includes an inlet housing, a transonic impeller, a vaned diffuser, a bend, and de-swirl vanes. The inlet housing delivers the flow to the impeller eye. The impeller is backswept and has 17 main blades plus 17 splitters. The diffuser includes 25 aerodynamically profiled vanes. The compressor design speed is about 45,000 rpm, and the entire stage produces a total pressure ratio near 6.5 at design condition. Steady performance of the compressor stage is characterized using the total pressure and total temperature measurements at compressor inlet (station 1) and de-swirl exit (station 5), and static pressure taps are located throughout the flow passage to characterize the stage and component static pressure characteristics, as shown in FIG. 7a.

Figure 7B:
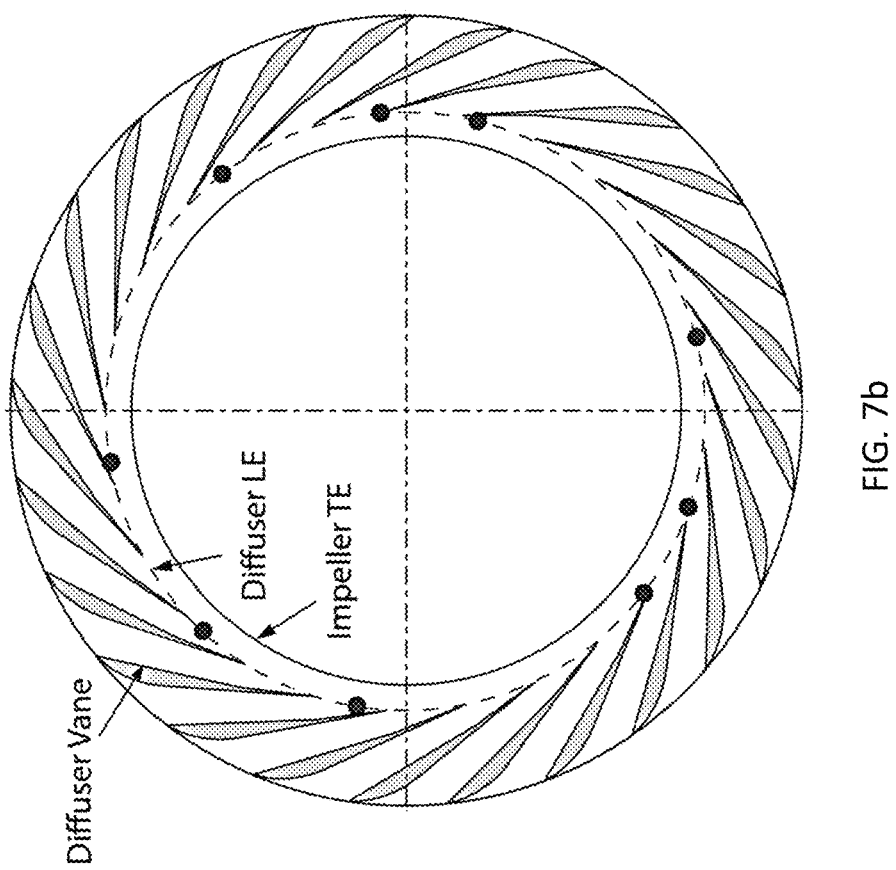
FIG. 7b is a diagram depicting distribution of the static pressure taps at a diffuser leading edge.

The distribution of the static pressure taps at the diffuser leading edge is shown in FIG. 7b. There are a total of nine static pressure taps placed non-uniformly along the circumferential direction. Each of them is placed in a different diffuser passage at a different pitchwise location from 10% to 90% pitch. Details of the circumferential and pitchwise locations for these pressure taps are shown in Table 2.

TABLE 2

DIFFUSER LEADING EDGE STATIC PRESSURE TAP LOCATIONS

| Description | Circumferential Position (deg) | Pitchwise Position (%) | Passage No. |
| --- | --- | --- | --- |
| P1 | 52.0 | 60 | 4 |
| P2 | 85.1 | 90 | 6 |

TABLE 2-continued

DIFFUSER LEADING EDGE STATIC PRESSURE TAP LOCATIONS

| Description | Circumferential Position (deg) | Pitchwise Position (%) | Passage No. |
| --- | --- | --- | --- |
| P3 | 103.9 | 20 | 8 |
| P4 | 165.8 | 50 | 12 |
| P5 | 198.9 | 80 | 14 |
| P6 | 217.6 | 10 | 16 |
| P7 | 279.5 | 40 | 20 |
| P8 | 312.7 | 70 | 22 |
| P9 | 350.1 | 30 | 25 |

Figure 8:
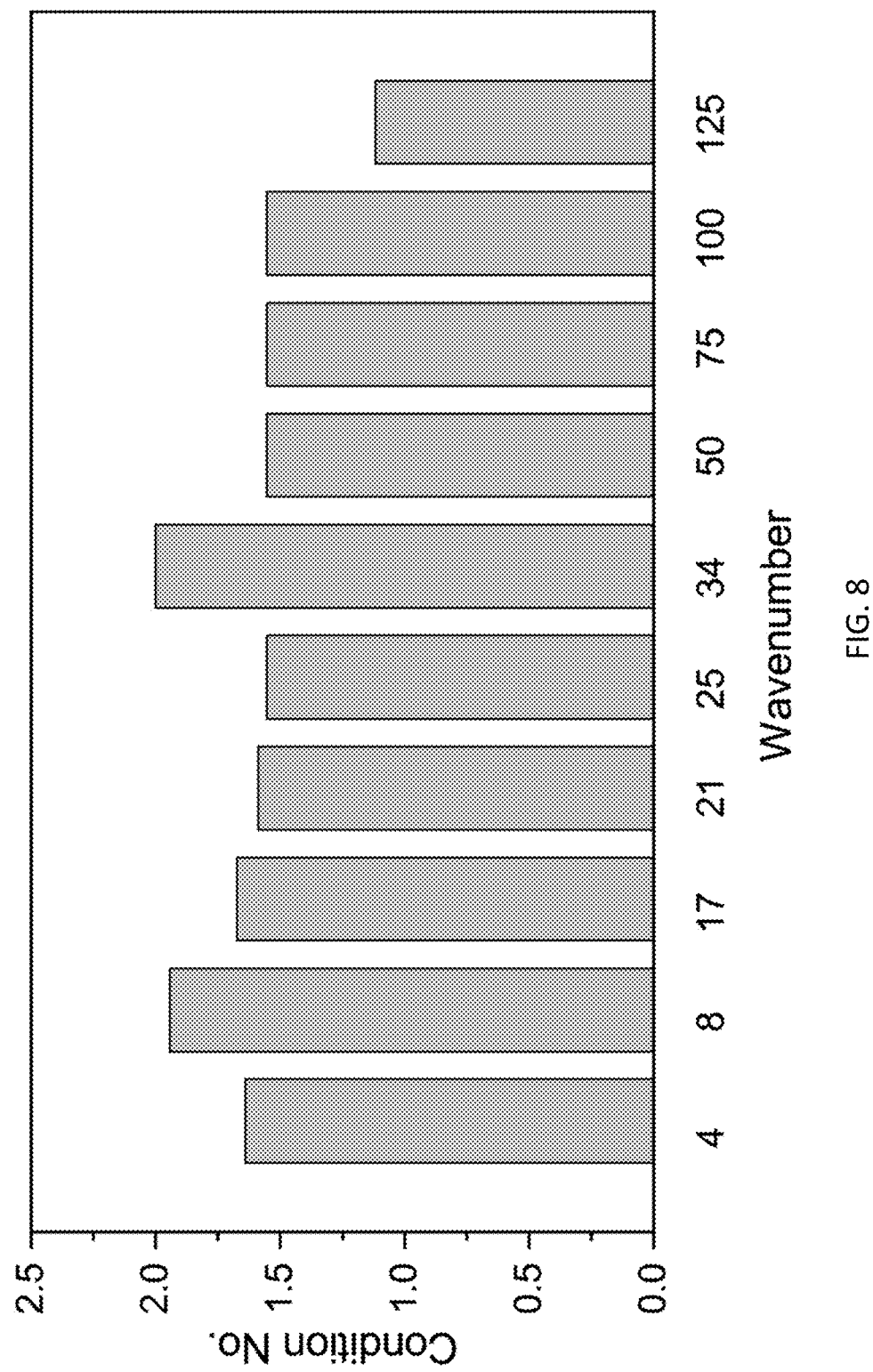
FIG. 8 is a histogram of condition number vs. wavenumber for 10 selected wavenumbers.

Based on the above teachings for selection of wavenumbers of most importance, a total of ten wavenumbers of interest were selected. These include the first two harmonics from the wakes at station 1 caused by the struts and rakes (Wn=4 and 8), the first five harmonics of the diffuser counts (Wn=25, 50, 75, 100, and 125), and the interactions between the compressor inlet struts and the vaned diffuser (Wn=21, 17, and 34). The condition numbers of the probe set for the 10 selected wavenumbers are shown in FIG. 8. The values of all the condition numbers fall in the range between 1.0 to 2.0 indicating the probe set is able to characterize all wavenumbers of interest. However, it is worth noting that this is a unique case. For instance, out of the multiple probe sets instrumented along the flow path at different stations (impeller exit, diffuser leading edge, etc.), only the probe set located at the diffuser leading edge yields a reasonable condition number.

Those having ordinary skill in the art will recognize that numerous modifications can be made to the specific implementations described above. The implementations should not be limited to the particular limitations described. Other implementations may be possible.

The invention claimed is:

1. A method of optimizing probe placement in a turbomachine, comprising:
   establishing a design matrix A of size m×(2N+1) utilized in developing flow properties around an annulus of a turbomachine, where m represents the number of datapoints at different circumferential locations around the annulus, and N represents dominant wavelets generated by upstream and downstream stators and blade row interactions formed around an annulus, wherein m is greater or equal to 2N+1; and
   optimizing probe positioning by iteratively modifying probe positions placed around the annulus and for each iteration determining a condition number of the design matrix A for each set of probe positions until a predetermined threshold is achieved for the condition number representing an optimal probe layout.

2. The method of claim 1, wherein the condition number represents changes in a circumferential flow property for a predetermined change in probe positions.

3. The method of claim 2, wherein the predetermined change in probe positions is defined as between $\pm\theta_c$ where $\theta_c$ is between about 0 and 360 in degree.

4. The method of claim 3, wherein the condition number is less than or equal to 2.0 for wavenumbers less than 3.

5. The method of claim 3, wherein the condition number is less than or equal to 4.0 for wavenumbers between 3 and 5.

6. The method of claim 3, wherein the condition number is less than or equal to 6.0 for wavenumbers greater than 5.

7. The method of claim 1, where A is determined based on AF=x, wherein
F is a vector containing 2N+1 unknown coefficients, and
x is an m-element vector representing a desired flow property around the annulus.

8. The method of claim 7, wherein $$A = \begin{pmatrix} \sin W_{n,1}\theta_1 & \cos W_{n,1}\theta_1 & \ldots & \sin W_{n,N}\theta_1 & \cos W_{n,N}\theta_1 & 1 \\ \sin W_{n,1}\theta_2 & \cos W_{n,1}\theta_2 & \ldots & \sin W_{n,N}\theta_2 & \cos W_{n,N}\theta_2 & 1 \\ \vdots & \vdots & \vdots & \vdots & \vdots & \vdots \\ \sin W_{n,1}\theta_m & \cos W_{n,1}\theta_m & \ldots & \sin W_{n,N}\theta_m & \cos W_{n,N}\theta_m & 1 \end{pmatrix};$$

$$F = \begin{pmatrix} a_1 \\ b_1 \\ \vdots \\ a_N \\ b_N \\ c_0 \end{pmatrix};$$

$$x = \begin{pmatrix} x(\theta_1) \\ x(\theta_2) \\ \vdots \\ x(\theta_m) \end{pmatrix},$$

where $\theta_i$ represents probe location and wherein Wn is wavenumber of N dominant wavelets generated by upstream and downstream stators and blade row interactions formed around an annulus, wherein the wavenumber represents how many times a wavelet repeats along the annulus, wherein N is a predetermined number based on vane counts of the blade rows and the wavenumber Wn represents the number of the complete cycle of a wave over its wavelength along the annulus.

9. The method of claim 1, wherein the condition number of A is based on one norm which represents a maximum sum of absolute numbers in each column of A.

10. The method of claim 1, wherein the condition number of A is based on infinity norm which represents a maximum sum of absolute number in each row of A.

11. The method of claim 1, wherein the condition number of A is based on Euclidean norm which represents a square root of a sum of all squares of each entry in A.

12. The method of claim 1, wherein the condition number of A is based on two norm which represents a square root of a maximum eigenvalue of the matrix ($A^T \cdot A$), where $A^T$ is a transpose of A for a real matrix and a Hermitian conjugate of A for a complex A, wherein eigenvalues of a matrix is defined by solving $\det(A^T - \delta I) = 0$ where, det represents a determinant of a matrix, $\delta$ represents the eigenvalues, and I represents the identity matrix.

13. The method of claim 1, wherein the condition number of A is based on max norm which represents the largest absolute value of all the entries in A.

14. The method of claim 1, wherein the iteratively modifying the probe positions is selected from the group consisting of a particle swarm optimization algorithm, a simulated annealing algorithm, a genetic algorithm, and an evolutionary algorithm.

* * * * *